United States Patent [19]

Kaman

[11] Patent Number: 5,668,312
[45] Date of Patent: Sep. 16, 1997

[54] PORTABLE APPARATUS FOR TESTING ELECTRONIC ENGINE CONTROL SYSTEMS

[75] Inventor: Richard A. Kaman, Spring Grove, Ill.

[73] Assignee: Products Research, Inc., Addison, Ill.

[21] Appl. No.: 685,157

[22] Filed: Jul. 23, 1996

Related U.S. Application Data

[63] Continuation of Ser. No. 387,034, Feb. 10, 1995, abandoned.
[51] Int. Cl.⁶ .................................................. G01M 15/00
[52] U.S. Cl. ........................ 73/116; 324/379; 324/383; 324/402
[58] Field of Search ..................... 73/116, 117.1, 73/118.1, 119 R; 324/379, 383, 386, 402

[56] References Cited

U.S. PATENT DOCUMENTS

| | | | |
|---|---|---|---|
| 3,551,800 | 12/1970 | Widmer | 324/383 |
| 3,956,689 | 5/1976 | Murakami et al. | 324/379 |
| 4,009,375 | 2/1977 | White et al. | |
| 4,035,619 | 7/1977 | Cholet | 324/383 |
| 4,064,450 | 12/1977 | Morales et al. | 324/383 |
| 4,385,278 | 5/1983 | Sterling | 324/381 |
| 4,926,331 | 5/1990 | Windle et al. | |
| 5,157,610 | 10/1992 | Asano et al. | |
| 5,227,766 | 7/1993 | Endo | |
| 5,257,190 | 10/1993 | Crane | |
| 5,307,290 | 4/1994 | Raviglione et al. | 73/117.1 |
| 5,396,427 | 3/1995 | Piehl et al. | 324/379 |

FOREIGN PATENT DOCUMENTS

| | | |
|---|---|---|
| 34660 | 1/1991 | Japan. |
| 2263376 | 7/1993 | United Kingdom. |

Primary Examiner—George M. Dombroske
Assistant Examiner—Eric S. McCall
Attorney, Agent, or Firm—Welsh & Katz, Ltd.

[57] ABSTRACT

A portable apparatus is provided for testing an engine control system of a reciprocating engine. The apparatus includes a processor for generating a simulated waveform of an at least one engine position sensor and a connector for operably coupling the selected waveform to the engine control system.

22 Claims, 11 Drawing Sheets

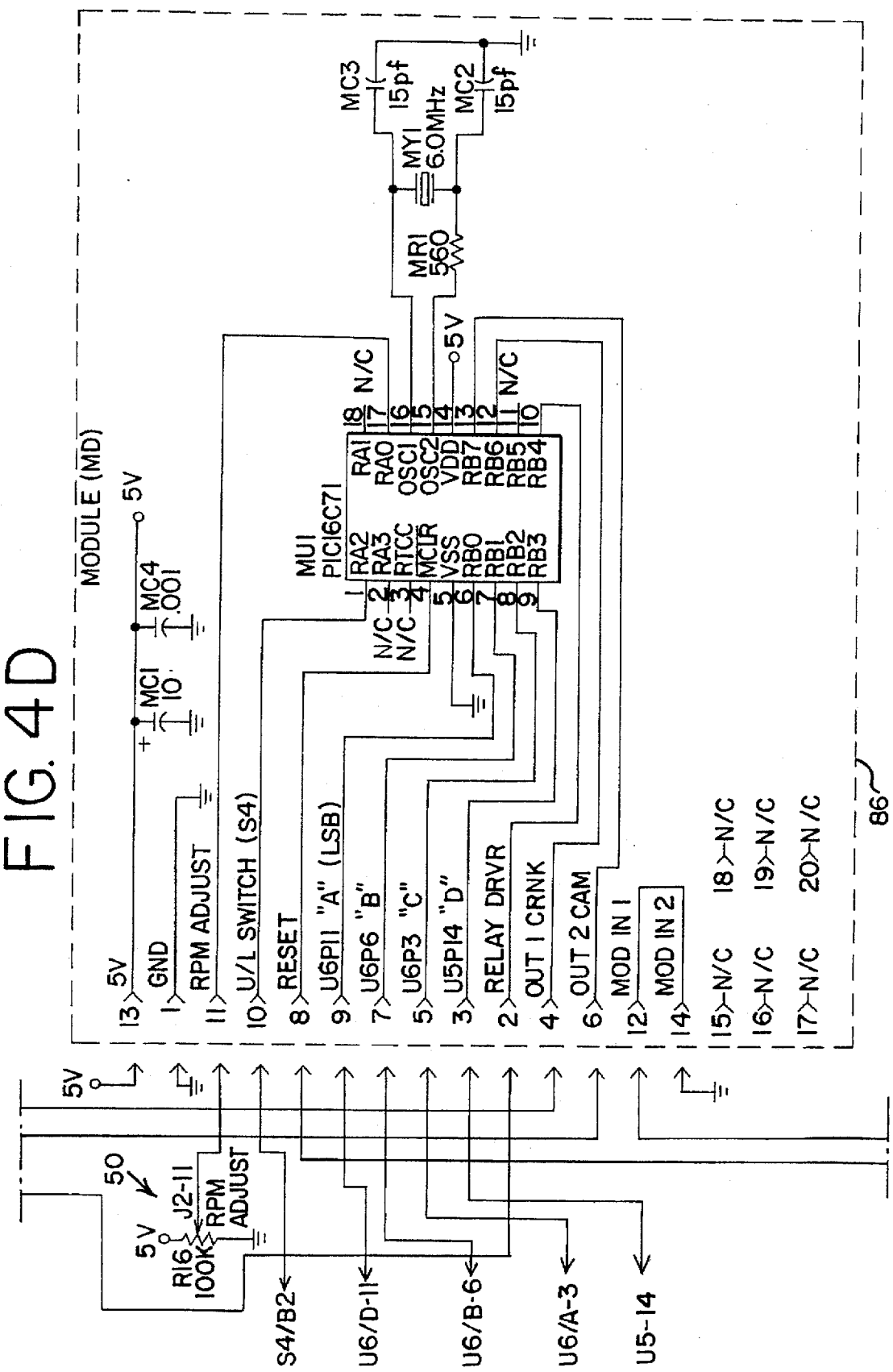

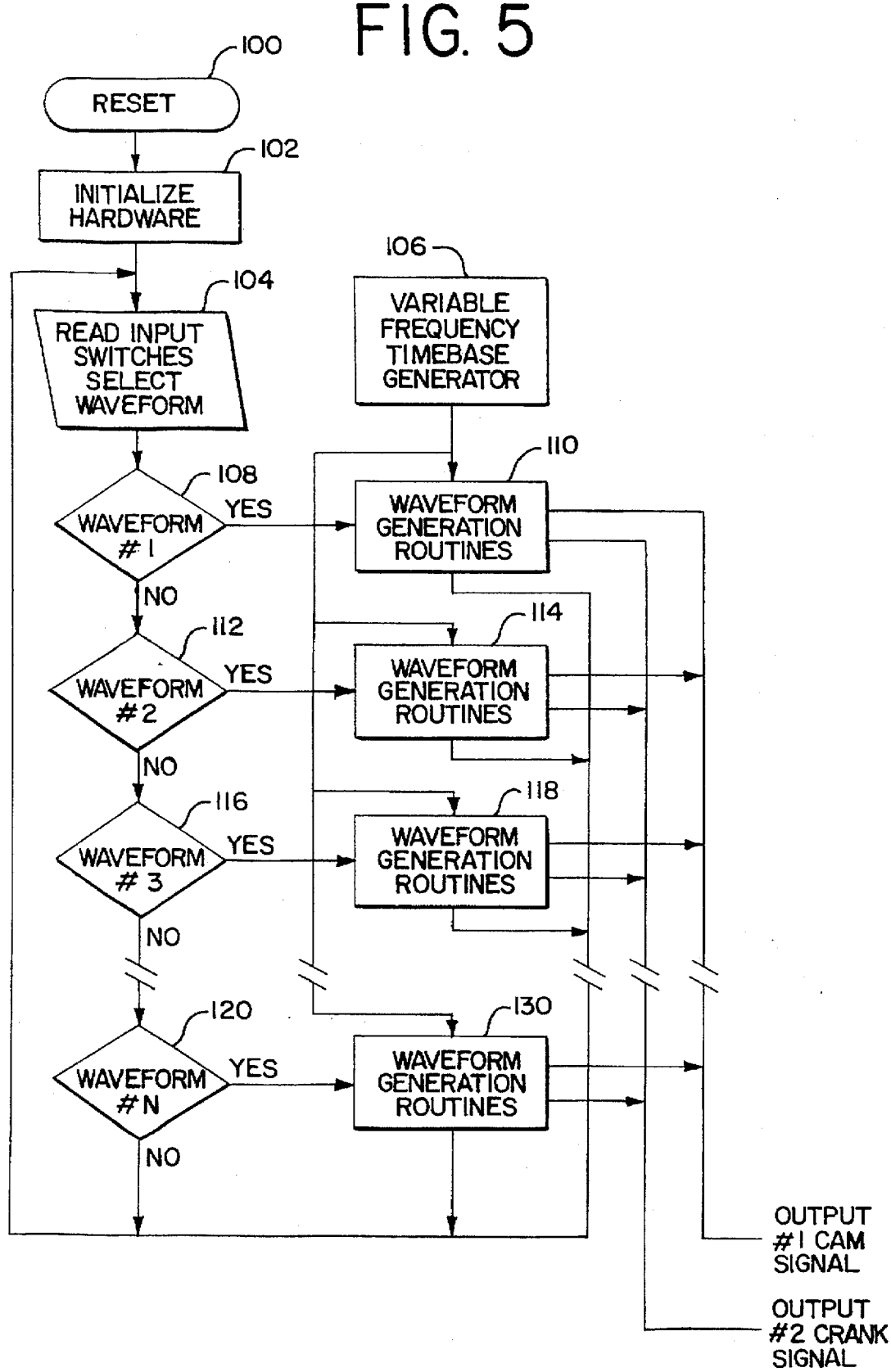

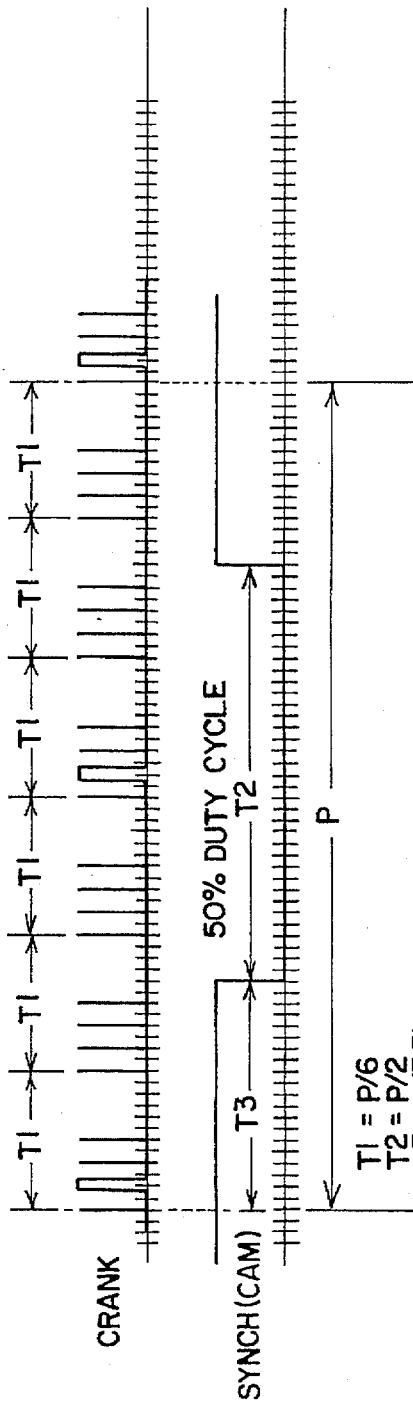
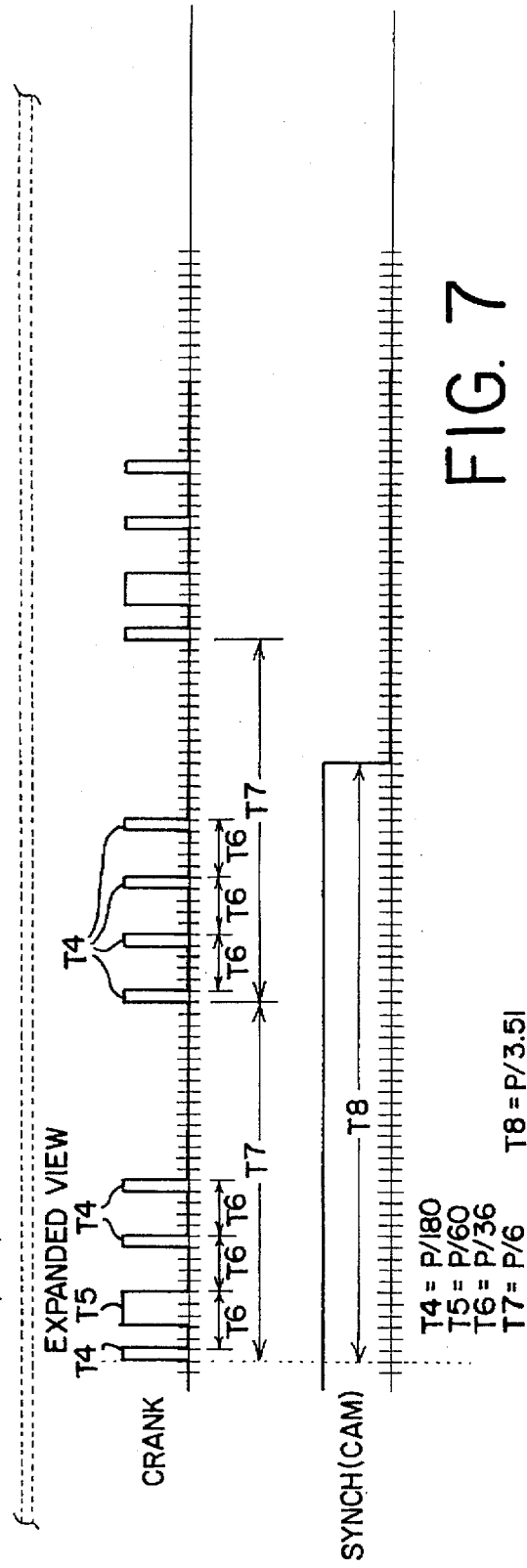
FIG. 7

PORTABLE APPARATUS FOR TESTING ELECTRONIC ENGINE CONTROL SYSTEMS

This is a continuation of application Ser. No. 08/387,034, filed Feb. 10, 1995 now abandoned.

FIELD OF THE INVENTION

The field of the invention relates to test equipment for automobile engines and more particularly to test circuits for engine control systems.

BACKGROUND OF THE INVENTION

With the recognition that automobiles are a major contributor to air pollution, automobile manufacturers of performance cars and otherwise have come to rely on computers as a means of controlling engine operating parameters while maximizing efficiency. Computers have been relied upon because of their almost infinite ability to adapt to a changing engine operating environment while optimizing engine operating parameters.

For example, it has long been known that a cold automobile engine requires a richer air-fuel mixture than a warm engine for proper operation. Even after an engine has reached a normal operating temperature, the air-fuel mixture must be constantly adjusted to changing load conditions. An idling engine, for example, need only be supplied with enough fuel to maintain an idle speed at a constant number of revolutions per minute (RPM), whereas an engine under load requires a much richer fuel mixture.

To improve combustion efficiency, fuel injection has been increasingly relied upon as a means of achieving an optimal air-fuel mixture across the full range of engine speeds and loads. In fuel injection systems, a precise volume of fuel is sprayed either directly into the combustion chamber or into the air stream during an intake period of each combustion cycle. Fuel may be introduced by an injector located near an intake of each cylinder (direct injection) using a number of injectors or a single injector may be located proximate an engine throttle (throttle body injection). In both cases the volume of fuel introduced during an injection cycle is usually controlled by fuel injection control module based upon a throttle position.

Under direct injection or throttle body injection, the timing of the fuel injection is critical to good air-fuel mixing. If the timing of the injection is early or late the sprayed fuel simply condenses on the bottom of the intake manifold. The condensed fuel then enters the cylinders during subsequent intake cycles as a liquid instead of a vapor resulting in poor and incomplete combustion.

Another factor in ensuring complete combustion of the air-fuel mixture in the combustion chamber is the proper timing of a combustion spark. In the past, proper timing of the spark was controlled through a coil firing and spark distributing circuit (distributor) mechanically coupled to the engine camshaft. As a cylinder entered a combustion stroke, the mechanical movement of the camshaft positioned a rotor within the distributor towards a contact of a high voltage wire to the spark plug. At a pre-determined number of degrees before a piston within the combustion cylinder reached its upper-most position (top dead center (TDC)), an ignition control module associated with the distributor senses the position of distributor rotor shaft and applies a voltage pulse to an ignition coil firing the spark plug through the rotor and distributor.

Other ignition systems of more recent design (distributorless ignition systems) may provide an ignition coil for each pair of combustion cylinders while others provide a coil for each cylinder. A separate ignition module firing circuit is provided for each ignition coil. Such ignition systems do not have a distributor coupled to the camshaft for triggering a combustion spark through the coil and instead rely on solid state sensors (e.g., Hall effect sensors, magnetic pick-up coils, etc.) that are typically placed proximate the camshaft and crankshaft for detecting engine position. Such systems typically have a number of actuator structures (e.g., slots, cogs, pins, etc.) attached to the camshaft and crankshaft for activating the sensors, for proper firing of individual ignition modules.

The solid state sensors (crankshaft and camshaft) often provide signals to a control module that provides control for the generation of ignition and fuel injection control signals. Ignition and injector control, in fact, is often consolidated into a single engine control module (ECM).

While the consolidation of engine control functions into a small number of control modules has improved engine performance and reduced pollution, malfunctions have become harder to detect. Often a position sensor receives signals from a number of actuators distributed around a periphery of both the crankshaft and camshaft with the timing of ignition and fuel injection signals determined by a relative position of the sequence of detected signals. When an engine will not run (because of sensor failure or otherwise), a technician must, somehow, test for position sensing signals while cranking the engine. However, when an engine is cranked the heavy current required by a starter results in a low voltage condition on the sensors and may increased the difficulty in detecting the presence and timing of such signals, not to mention the deleterious effect of extended cranking.

Failure of an electronic engine component, in fact, often requires the use of data analyzers or other sophisticated trouble-shooting equipment for detecting and correcting problems. Data analyzers or sophisticated trouble-shooting equipment, on the other hand, tends to be expensive and provide limited functionality relative to price. Because of the importance of automobiles and reliable automobile operation, a need exists for a means and apparatus for simulating operation of engine position sensing without the necessity of actual engine operation or expensive, bulky equipment.

Accordingly it is a primary object of this invention to provide an apparatus that may be used as a substitute for an engine rotational position sensing system.

It is a further object of the invention to provide the functionality of module simulation within a portable device that is adapted to a number of vehicles.

It is a further object of the invention to provide an apparatus that may also be used to detect and give visual indication of proper sensor operation.

SUMMARY OF THE INVENTION

These and other objects are provided by a portable apparatus for testing an engine control system of a reciprocating engine. The apparatus includes a computer means for generating a plurality of simulated waveforms of at least one engine rotational position sensor and a connector for operably coupling the simulated waveform to the engine control system.

The problem of testing distributorless ignition and fuel injection systems without operating the engine can be solved through the use of simulator devices that can be interconnected with the engine control system and provide the functionality of upstream signal generation. Under an embodiment of the invention, simulated engine position signals for a particular type engine are generated within a simulator module and applied to the ECMs of an engine. The application of the simulated engine position signals causes sequencing of spark firing circuits and/or fuel injection circuits in a predictable manner. The use of the simulator module allows a technician to verify the presence of spark or fuel injection signals without the inconvenience or necessity of engine operation.

BRIEF DESCRIPTION OF THE DRAWINGS

FIG. 5 is a flow chart of processor operation of the engine sensor emulator of FIG. 2;

FIG. 7 is a timing diagram of a particular waveform generated by the engine position sensor emulator of FIG. 2;

FIG. 10 is a printout of object code of the engine position sensor emulator in accordance with the invention.

FIG. 11 is an application table of the engine position sensor emulator of FIG. 10.

DESCRIPTION OF A PREFERRED EMBODIMENT

A portion of the disclosure of this patent document contains material which is subject to copyright protection. The copyright owner has no objection to the facsimile reproduction by anyone of the patent disclosure as it appears in the Patent and Trademark Office patent files or records, but otherwise reserves all copyright rights whatsoever.

Figure 1:
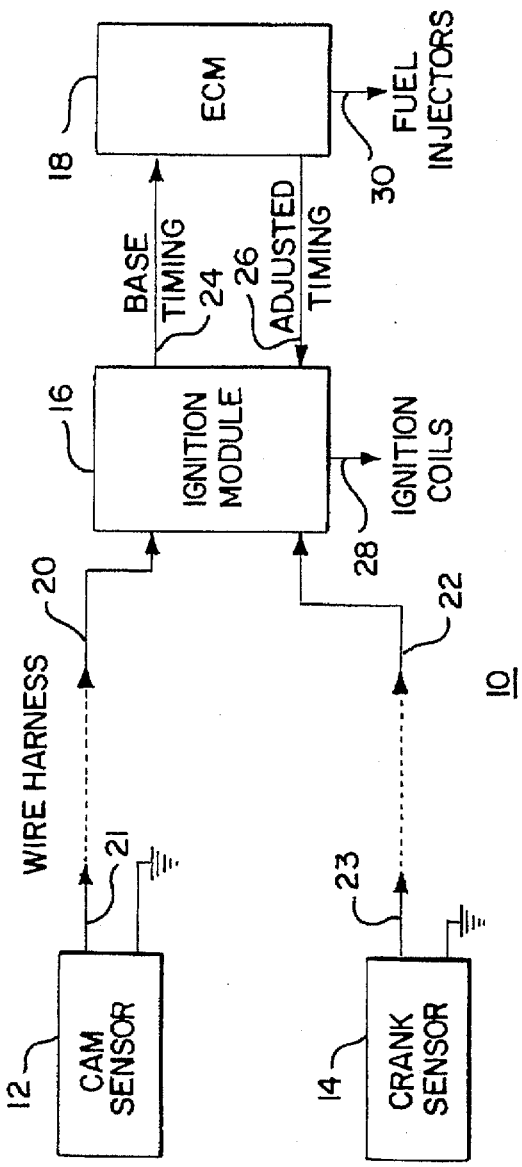
FIG. 1 is a block diagram of a prior art vehicular engine control system.

FIG. 1 is a block diagram of a prior art engine control system 10, generally. As shown, an ignition module 16 receives a crankshaft position signal from a crankshaft sensor 14 through wires 23, 22 and the engine wire harness. In most automobile engines, the ignition module 16 also receives a camshaft position signal from a camshaft position sensor 12 through wires 21, 20 and the engine wire harness. The ignition module 16 uses the position signal(s) to generate a base timing signal which is transferred to the ECM 18 through an interconnect wire 24. The ECM 18, relying on other sensors (not shown) such as temperature or barometric pressure, may adjust the base timing to accommodate local engine environmental operating conditions and return an adjusted timing signal to the ignition control module 16 on wire 26. The ignition control module 16 uses the adjusted timing signal provided on wire 26, in turn, to generate firing signals for the individual ignition coils through interconnect wiring 28 (it being understood that interconnect wiring 28 includes separate circuits for transferring the firing signals for at least two ignition coils). Likewise, the ECM 18 uses the adjusted timing signals internally to generate fuel injection signals on interconnect wiring 30 to trigger the fuel injector(s) (not shown).

Contained within the crankshaft position signal from the crank sensor 14 (or within the combination crankshaft position signal and camshaft position signal) is indicia of absolute engine position. The indicia of absolute engine position is necessary because the ignition coils must be activated in a particular sequence determined by the number of combustion cylinders and firing order. The indicia of absolute engine position is used by the ignition module 16 to enter the ignition firing sequence at the proper point in the sequence and to fire the first coil in the firing sequence. Subsequent signals from the crank sensor 14 (and cam sensor 12) may then be used to advance a sequencer within the ignition module 16 and to fire subsequent coils within the firing sequence. Where multi-port fuel injection is used the indicia of absolute engine position is transferred to the ECM 18 and used to coordinate the injection sequence of the fuel injectors with crankshaft and camshaft positions.

Figure 2:
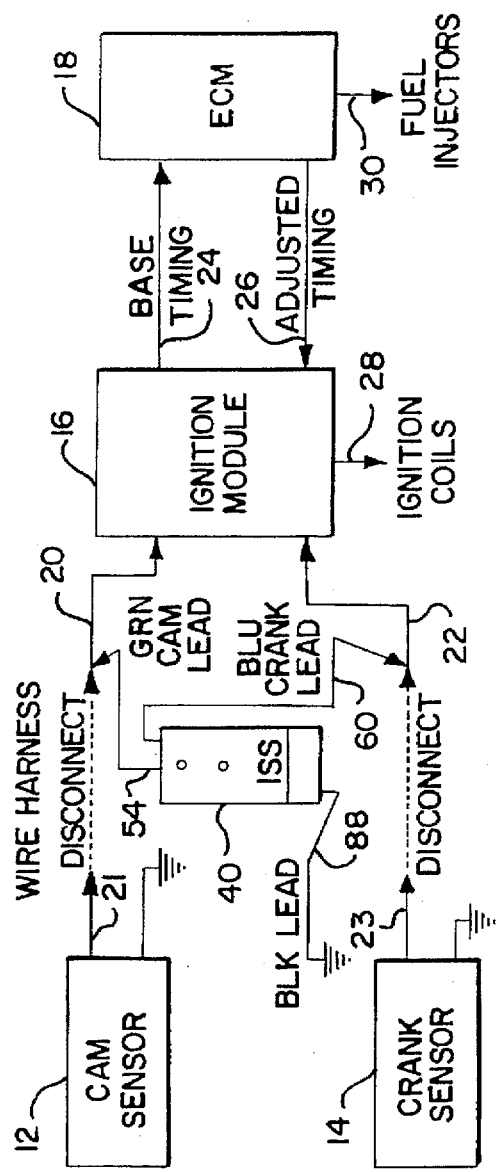
FIG. 2 is a block diagram of a vehicular engine control system interconnected with an engine rotational position sensor emulator in accordance with the invention.

FIG. 2 is a block diagram of the ignition system 10 interconnected with an ignition system simulator (ISS) 40 according to the invention. Under an embodiment of the invention, the ISS 40 simulates crankshaft and camshaft position signals normally generated within the crank sensor 14 and cam sensor 12. To facilitate use of the ISS 40 with the control system 10, the crank sensor 14 and cam sensor 12 are disconnected while simulated signals are introduced to the ignition module 16 through interconnect wires 20, 22. Introduction of the simulated signals from the ISS 40 to the ignition module 16 allows the ignition module 16 and ECM module 18 of the control system 10 to be operated in a normal manner (sequenced) without starting the engine to which the engine control system 10 is connected.

Figure 3:
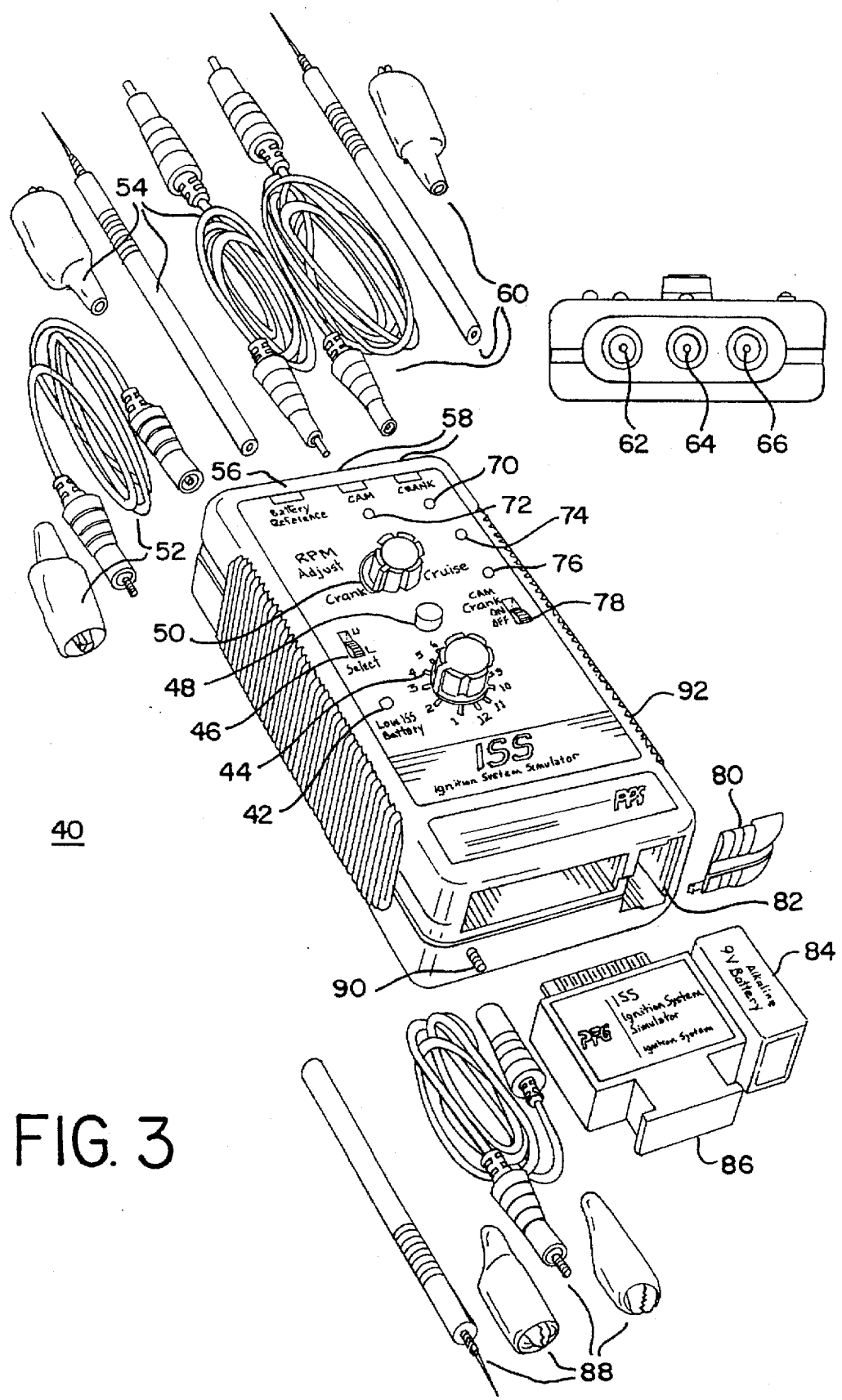
FIG. 3 is a exploded view of the engine position sensor emulator of FIG. 2.
Figure 4A:
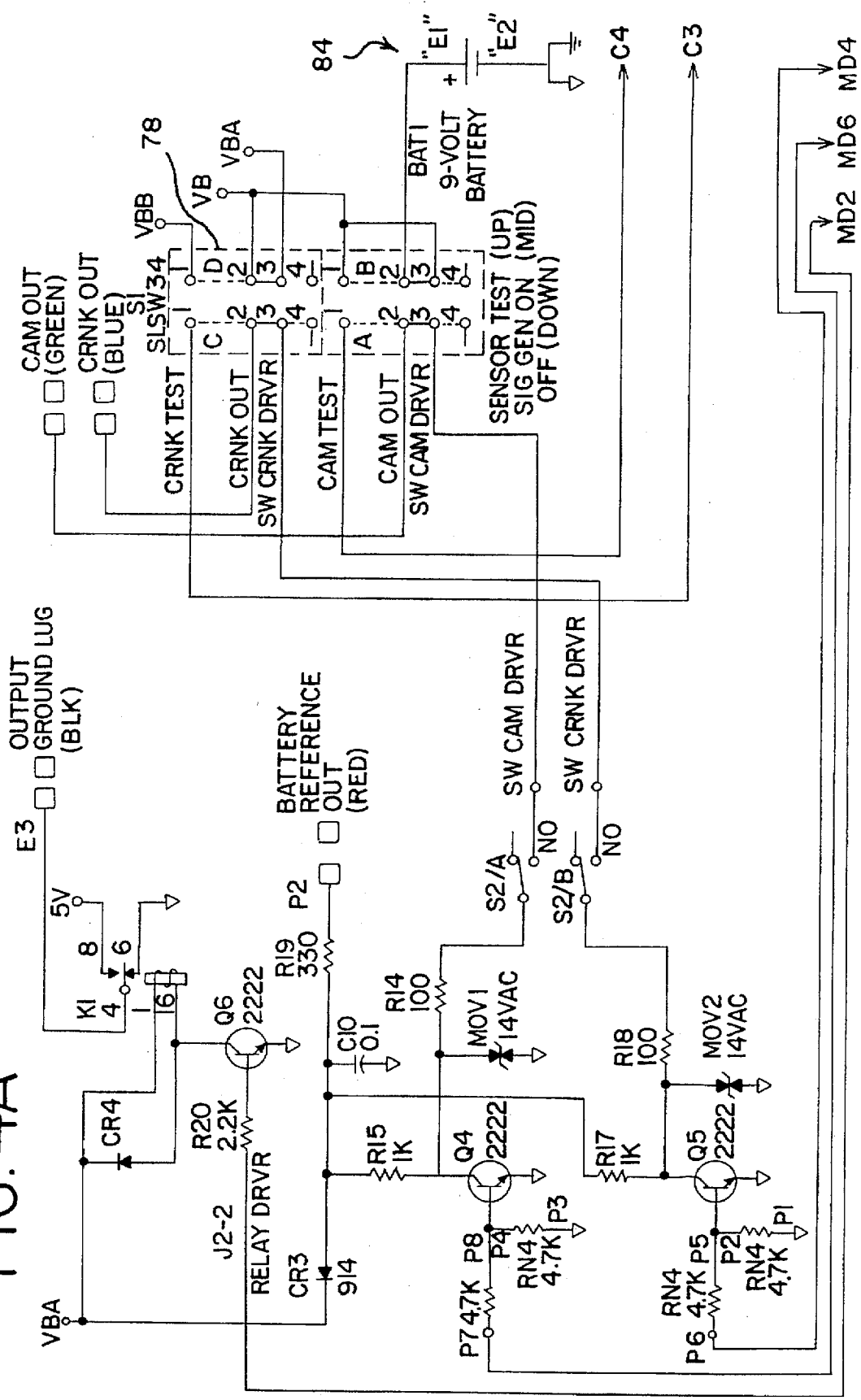
FIG. 4 is a schematic circuit drawing of the engine position sensor emulator of FIG. 2.
Figure 4B:
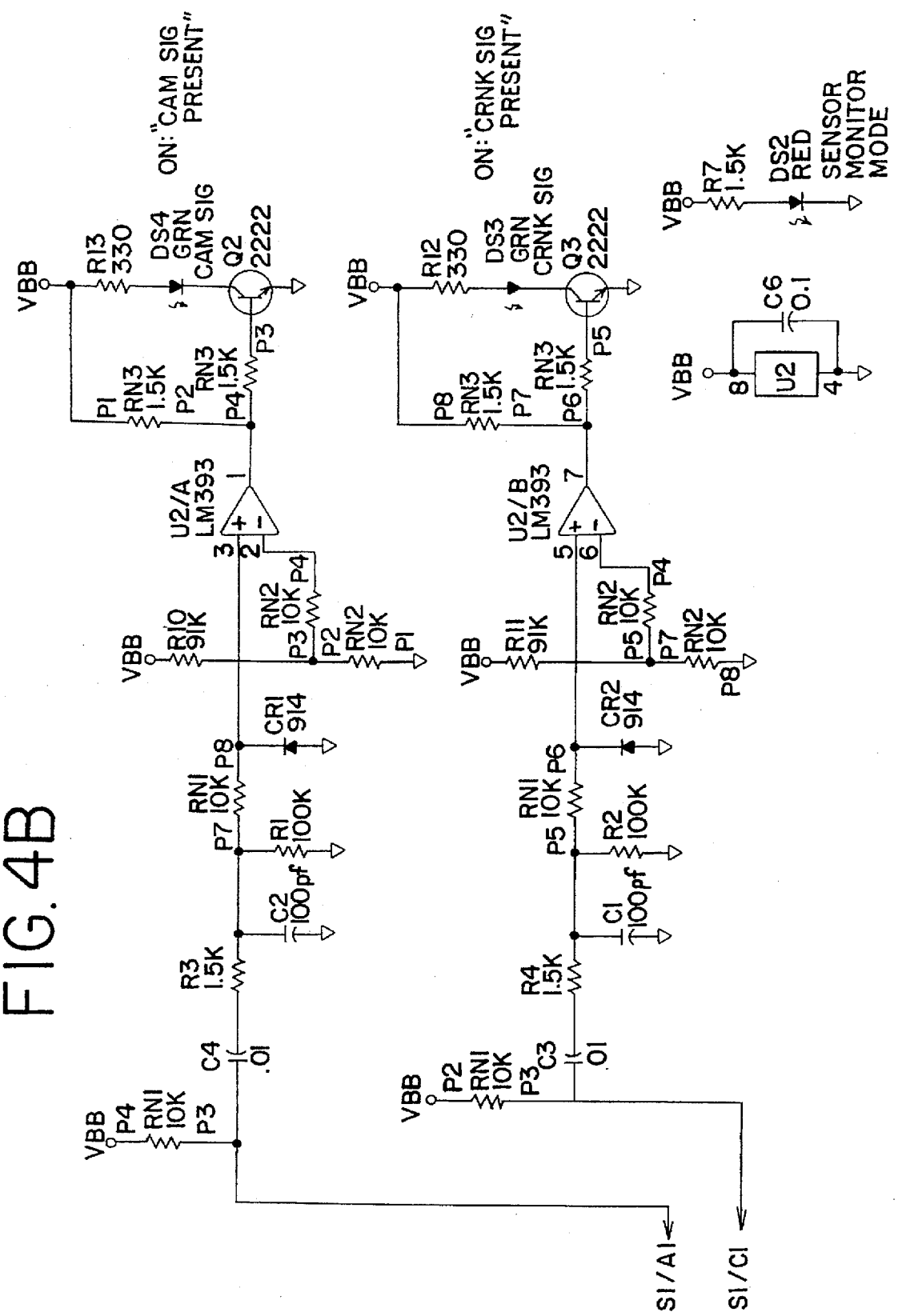
Figure 4C:
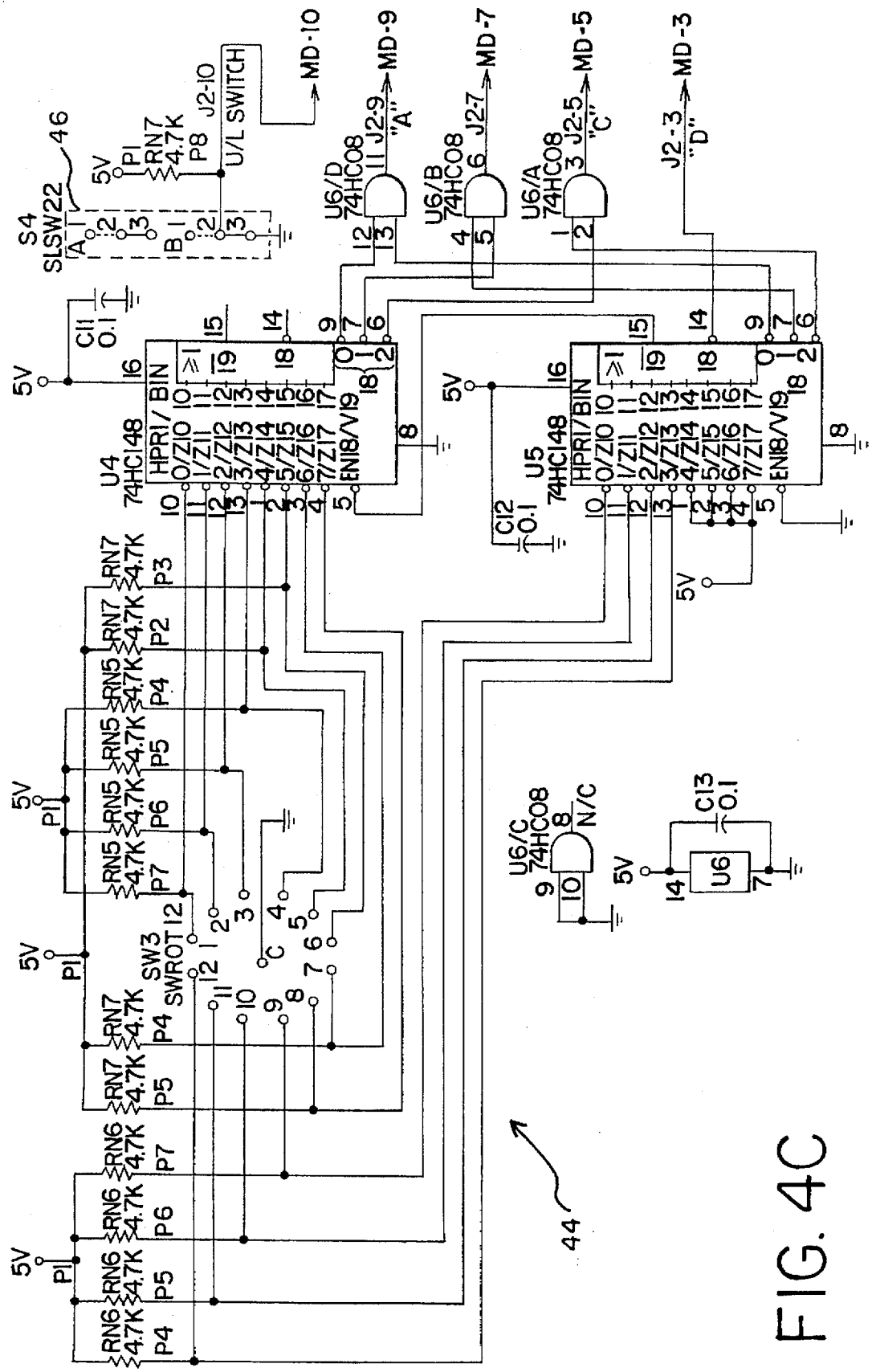
Figure 4E:
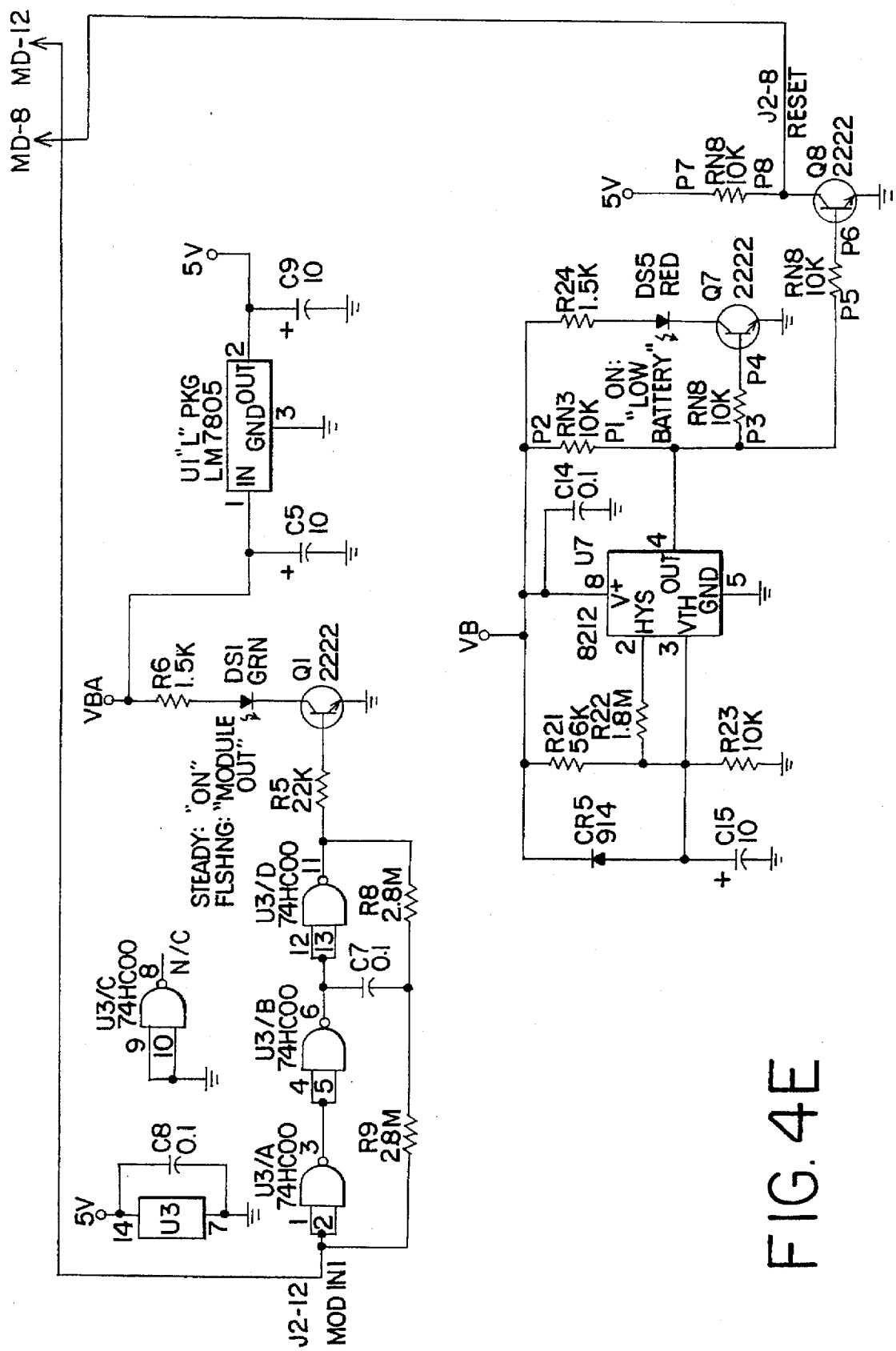
Figure 6:
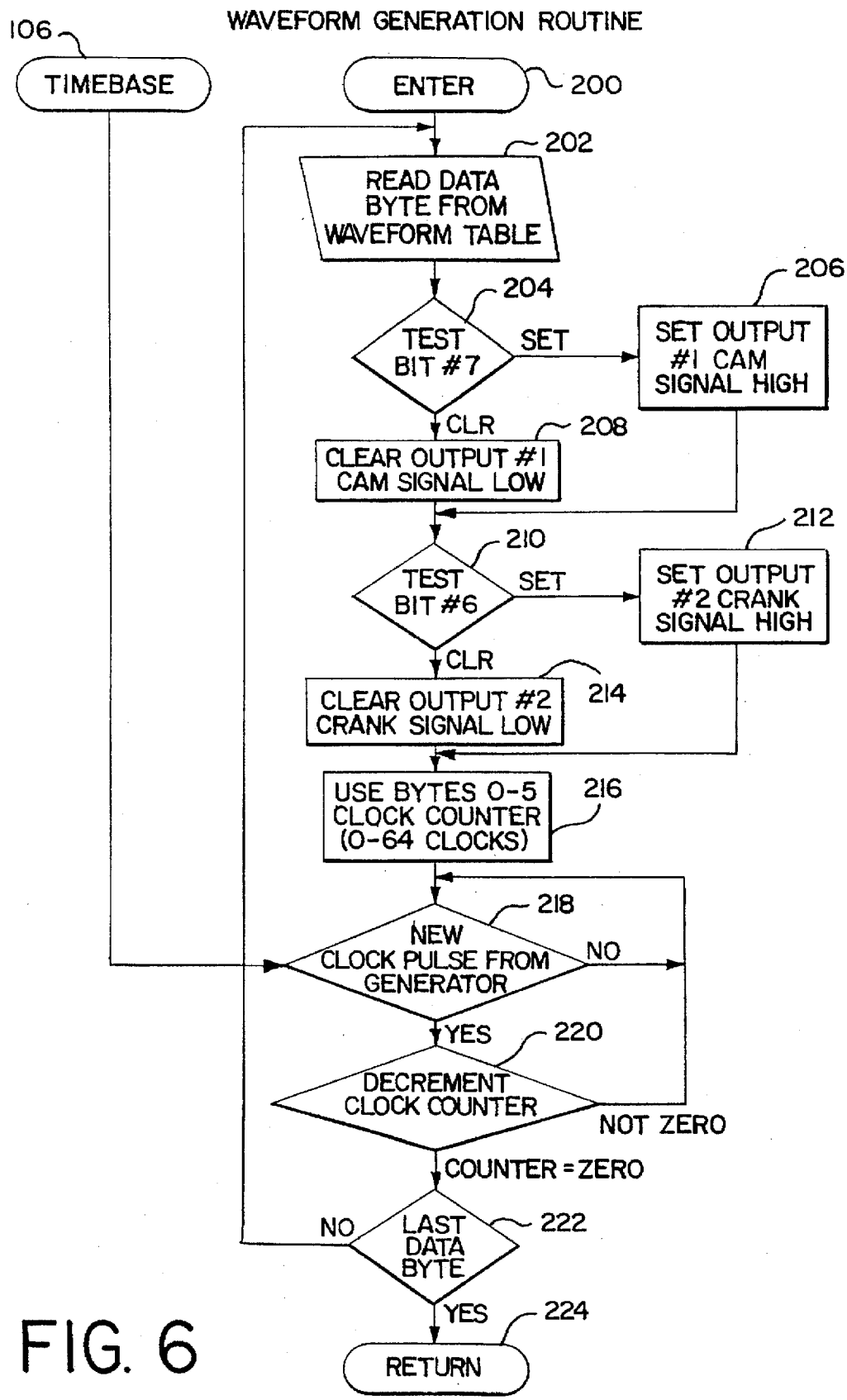
FIG. 6 is a flow chart of waveform generation of the engine position sensor emulator of FIG. 2.

FIG. 3 is an exploded view of a specific embodiment ISS 40. As shown, the ISS 40 includes a portable enclosure 92 containing a 9 volt alkaline battery 84 and a waveform module 86. Also shown as part of the ISS 40 is a number of test lead assemblies allowing the ISS 40 to be interconnected with an engine control system 10 of most popular automobiles currently sold within the U.S.

Provided as part of the group of test lead assemblies of the ISS 40 is a ground lead, probe, and clip 88 that may be interconnected to the ISS 40 via a threaded post 90. A blue, crank sensor lead, probe, and clip 60 provides a means of interconnecting between the crank sensing wire 22 of the control system 10 from a corresponding terminal 62 of the ISS 40. A green, cam sensor lead, probe, and clip 54 interconnects between the cam sensing wire 20 of the system 10 and corresponding terminal 64 of the ISS 40. A battery reference lead and clip 52 is also provided and interconnected with a terminal 66 the ISS 40.

The battery reference lead and clip 52 is used to increase the ISS 40 output signal levels to the level of the vehicle's battery for those systems that may have this requirement. The increase in output signal level occurs when the lead and clip 52 is connected to the vehicle's positive battery terminal or any wire whose voltage level is the same as the vehicle's positive battery terminal.

In accordance with an embodiment of the invention, the waveform module 86 is removable and contains data for generation of a plurality of waveforms. In the preferred embodiment, the module 86 contains data for up to twenty-four different vehicles. Selection of a particular waveform is made by turning the selector switch 44 to a pre-determined position and by setting an upper/lower (U/L) two-position switch 46. The twelve position selector switch 44 and two-position switch 46 together provides access to up to twenty-four waveforms within the waveform module 86.

Also provided within the ISS 40 is a speed (RPM) adjusting control 50. The RPM control 50 allows the rate at which the waveforms are applied to the engine control system 10 to be varied in a manner similar to varying engine speeds. The RPM adjusting control 50 allows an engine control system 10 to be varied from engine cranking speeds (e.g., 300 RPM) up to an engine cruise speed (e.g., 2500 RPM).

FIG. 4 is a schematic diagram of the ISS 40 in accordance with an embodiment of the invention. Reference shall be made to FIG. 4 as appropriate to an understanding of the invention.

As shown in FIG. 4 the waveform module 86 is made up generally of a general purpose microcontroller MU1 (e.g., a PIC16C71, for example, manufactured by Microchip Technology Inc.) and crystal oscillator (clock) circuit. The waveform module 86 may comprise any suitable circuitry for generating the desired waveforms. For example, the waveform module 86 may be a non-removable part of the ISS 40 including programmable memory, replaceable memory, or a memory large enough to store all desired waveform data. Waveform selection is accomplished through the combined action of the U/L switch 46 (S4) and the 12-position waveform selector switch 44 (S3). The position of the U/L switch 46 is detected by a logical "1" or "0" imposed on terminal 1 of the microprocessor MU1 through terminal 10 of the waveform module 86. The position of the waveform selector switch 44 is detected by the microprocessor MU1 by converting the individual outputs of the 12-position switch 44 into a 4-bit binary coded number within encoders U4, U5 and applying the 4-bit code to terminals 6–9 of the microprocessor MU1 through terminals 9, 7, 5, and 3 of the waveform module 86. The encoders U4, U5 may be any encoder (or encoder combination) capable of accepting 12 individual inputs and providing, in turn, a four-bit binary coded output (e.g., two 74HC148 ten line decimal to four line binary coded decimal converters).

To use the ISS 40 (FIG. 2), a technician (not shown) removes interconnecting wires 21, 23 from the cam sensor 12 and crank sensor 14 and substitutes the ISS 40 as a signal source. The simulated crankshaft signal is transferred to the engine control system 10 by interconnecting the crankshaft test lead 60 between the crankshaft signal output terminal 62 of the ISS 40 to wire 20 of the ignition module 16 of the engine control system 10. Likewise, the simulated cam signal is transferred by interconnecting the cam test lead 54 between the cam signal output terminal 64 to wire 22 of the ignition module 16. A signal ground is provided by interconnecting a ground lead 88 between the ground terminal 66 of the ISS 40 and a chassis ground of the engine control system 10.

To activate the ISS 40, an ISS control switch 78 (S1) is moved to a middle (ON) position. Moving the ISS control switch 78 to the middle position provides a current path between the battery 84 and a regulated 5 volt power supply on the lower left of FIG. 4. The output of the 5 volt supply is then applied to terminal 14 of the microprocessor MU1 through terminal 13 of the waveform module 86.

Moving the ISS control switch 78 to the middle position also causes a reset circuit shown on the bottom center of FIG. 4 to generate a reset pulse. The reset pulse is applied to terminal 4 of the microprocessor MU1 through terminal 8 of the waveform module 86.

FIG. 5 is a flow chart of program operation of the microprocessor MU1 in accordance with one embodiment of the invention. FIG. 10 is a printout of the object code of one particular waveform module 86 developed for Chrysler automobiles. The flow chart of FIG. 5 will be used to describe the program operation of the object code shown in FIG. 10.

Following generation of the reset pulse 100, the microprocessor MU1 initializes 102 interconnected hardware. Following initialization 102, the microprocessor reads 104 input switches 44, 46 on the waveform selection input terminals 1, 6–9 of the microprocessor MU1. The bits on the waveform selection terminals 1, 6–9 are used by the microprocessor MU1 to locate routines (or data for use in a commonly stored routine) within a memory (not shown) of the microprocessor MU1. The routines are used for the generation of each waveform. The microprocessor MU1 may locate waveforming routines via a look-up table stored within memory or through a locating routine that apportions memory into discrete blocks based upon some algorithmic locating process.

Where a look-up table is used to locate waveform routines for waveform generation, the microprocessor MU1 reads the bits on the waveform selection input terminals and compares the bits with values found within the look-up table. If the bits match 108 the bits stored in the first location for waveform #1, then the microprocessor MU1 uses the pointer associated with the first location as an indication of a starting point for the waveform generating routine for generating the cam and crankshaft output signals. If the bits do not match the bits found in the first location of the look-up table, the processor MU1 advances to the second location and compares 112 the bits with the bits found in the second location for waveform #2. If a match occurs in the second location, the processor MU1 goes to the location specified by the pointer of the second location for generation of the second waveform. If the bits in the second location does not match then the processor MU1 continues through the look-up table until the bits match 120 and a waveform generating routine has been identified.

Once a waveform generating routine has been identified, the processor MU1 proceeds to the pointer location specified in the look-up table and executes the selected routine 110, 114, 118, 130. As an aid to the generation of the selected waveform, a variable frequency timebase generator 106 is provided as an input to the selected waveform generating routine 110, 114, 118, 130. The variable frequency timebase generator 106 operates under the control of the RPM ADJUST 50 provided as an input at terminal 17 of the microprocessor MU1 through terminal 11 of the waveform generating module 86. The input from the RPM ADJUST 50 is a direct current signal that is converted to a digital signal within the processor MU1 by use of an analog to digital (A/D) converter (not shown). Following conversion to a digital signal the input from the RPM ADJUST 50 is used to generate a variable frequency timebase signal using an appropriate routine. The routine may use a divide by ten process or an appropriate module counter or some other appropriate routine to scale the clock signals of the timebase to the signal from the RPM ADJUST 50.

Following set-up of the time base, the processor MU1 reads 202 a first data byte from a waveform table of the routine 110, 114, 118, 130. The processor MU1 then uses a bit testing routine to set or reset the cam and crankshaft outputs on terminals 12, 13 of the processor MU1 based upon the results of the bit testing routine.

As a first step of the bit testing routine the processor MU1 tests 204 bit 7 of the data byte. If bit 7 is set, the processor MU1 sets the cam output on terminal 13 of the processor MU1 high. Otherwise, the processor MU1 resets 208 the output signal on terminal 13 of the processor MU1.

The processor MU1 then tests 210 bit 6 of the data byte. If bit 6 is set the processor sets 212 the crank output on terminal 12 of the processor MU1. Otherwise the processor MU1 resets 214 the crank output on terminal 12.

The processor MU1 then waits for a time period before reading the next data byte. The time period that the processor MU1 waits is determined by the contents of bits 0–5 of the data byte. Upon reaching the wait state the processor MU1 reads bits 0–5 and places 216 the bits within a counter. The counter is then decremented 218 by signals received from the time base 106. When the counter reaches zero, the processor MU1 tests 222 whether the data byte is the last byte in the routine, and if not, reads 202 another data byte and the process continues.

If the processor MU1 determines that the last data byte has been read 222, then the processor MU1 returns 224 to the main routine (FIG. 5). Upon returning to the main routine, the processor MU1 reads the input switches 104 and the process continues.

As the processor MU1 generates waveforms based upon switch 44, 46 positions, the processor MU1 outputs waveforms on terminals 12 and 13 of the processor MU1. The waveforms are transferred through terminals 4 and 6 of the waveform module 86 to a driver circuit in the upper left of FIG. 4. The driver circuit raises the simulated crankshaft and camshaft signals to a level compatible with automotive applications.

At the output of the driver circuit on the upper left of FIG. 4 is shown a switch (S2) which must be depressed to transfer the cam and crank signals from the driver circuit to the output terminals 62, 64 of the ISS 40. The switch S2 (also labeled 48 on FIG. 3) is a safety feature which prevents application of the cam and crank signals to the engine until such time as the SIGNAL OUT button 48 is depressed. Such safety feature prevents accidental firing of spark plugs where fuel may remain in engine cylinders creating the possibility of ignition of such fuel and backfiring of the engine.

FIG. 1 shows application data for the waveform module 86 of FIG. 10 (module model number CRMV1.0). The far left column (with a heading ISS) indicates waveform selector switch position. The "L" on the left side of the first entry indicates that the U/L switch 46 should be in the L position for Chrysler 3.0L MPFI engines. The column also indicates that the waveform selector switch 44 should be in position 2.

FIG. 7 shows ISS 40 simulated crank and cam sensor outputs for the switch positions shown in the top row of FIG. 11 for the Chrysler 3.0L MPFI engine. As shown, the cam output of the ISS 40 repeats every 720 degrees while the crank output repeats every 360 degrees.

Figure 8:
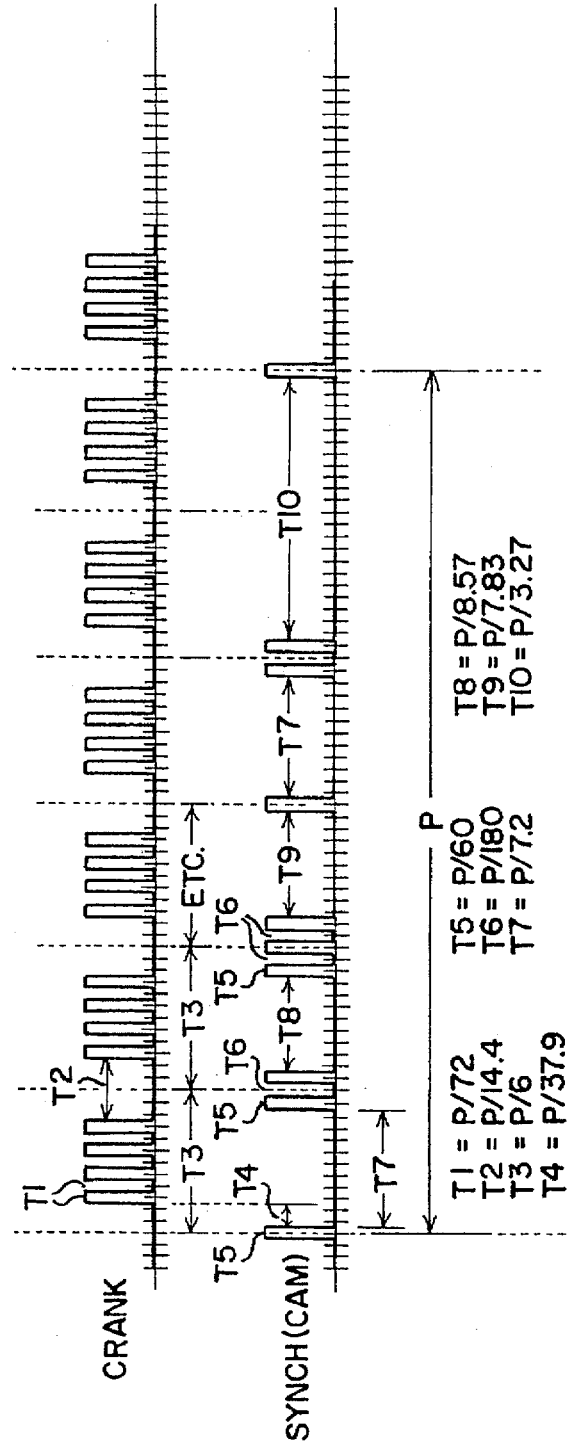
FIG. 8 is a timing diagram of a particular waveform generated by the engine position sensor emulator of FIG. 2.

FIG. 8 shows ISS 40 outputs for a Chrysler 3.0L PRV MPFI 6 cylinder engine. As shown in FIG. 11 the indicated position for the U/L switch 46 is in the U position. The indicated position for the waveform selector switch 44 is in position 3.

Figure 9:
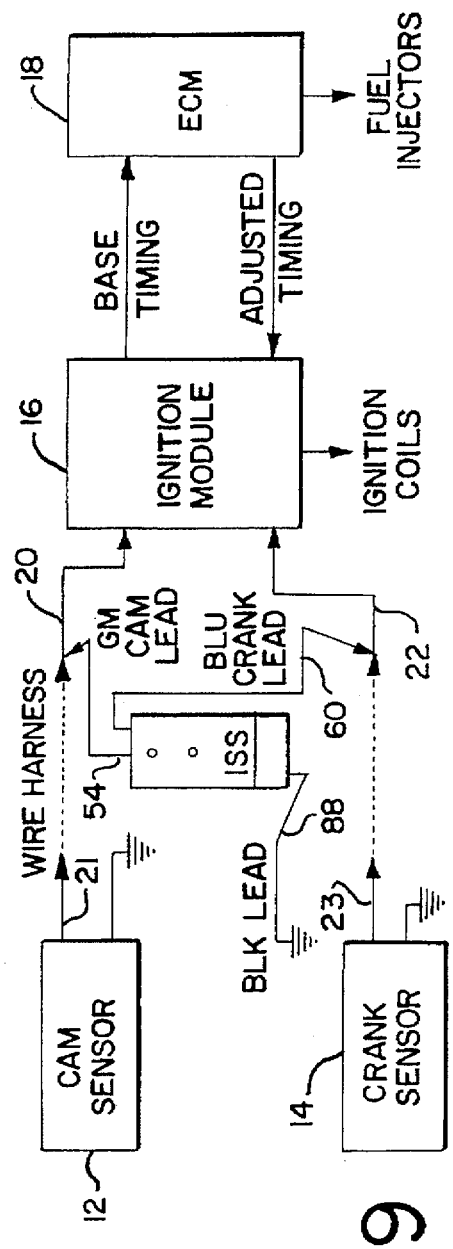
FIG. 9 is a block diagram of the use of the engine position sensor emulator of FIG. 2 used for the detection of engine position signals.

In another embodiment of the invention, the ISS 40 is used to detect the presence or absence of the crank sensor 14 signals and cam sensor 12 signals. Under the embodiment contact is established (FIG. 9) between the probe 60 and wire 23 leading from the crank sensor 14. Contact may be established by piercing the insulation of the wire 23 using the pointed tip of the probe 60 or by any other appropriate method (e.g., backprobing, through use of "T" fitting, etc.). Likewise, contact is established between the probe 54 and the wire 21.

To monitor for signals from the crank sensor 14 and cam sensor 12, the control switch 78 of the ISS 40 is moved to a upper-most position. As the control switch 78 is moved to the upper-most position, the crank out terminal 62 and cam out terminal 64 of the ISS 40 is interconnected with a monitoring circuit shown in the upper right corner of FIG. 4. Signals entering the ISS 40 from the crank sensor 14 will cause light emitting diode (LED) DS3 to flash. Likewise, signals entering the ISS 40 from the cam sensor 16 will cause LED DS4 to flash. If the signals do not exceed some threshold value (e.g., 0.9 v) the lights will not flash.

A specific embodiment of an engine rotational position sensor simulator according to the present invention has been described for the purpose of illustrating the manner in which the invention is made and used. It should be understood that the implementation of other variations and modifications of the invention and its various aspects will be apparent to one skilled in the art, and that the invention is not limited by the specific embodiments described. Therefore, it is contemplated to cover the present invention any and all modifications, variations, or equivalents that fall within the true spirit and scope of the basic underlying principles disclosed and claimed herein.

What is claimed is:

1. A portable apparatus for testing an electronic engine control system of a reciprocating engine comprising:
   means for generating a first simulated waveform of a rotational position of a first rotating engine element of the reciprocating engine;
   means for generating a second simulated waveform having a predetermined phase offset with respect to the first simulated waveform; and
   connector means for operably coupling the first and second waveforms to the engine control system.

2. The apparatus as in claim 1 wherein the means for generating the first and second waveforms with the predetermined phase offset further comprises a processor.

3. The apparatus as in claim 2 wherein the means for generating the first and second simulated waveforms further comprises a plurality of removable memory modules and a receptacle disposed on the portable apparatus for one-at-a-time coupling of a memory module of the plurality of memory modules with the processor.

4. The apparatus as in claim 3 wherein each memory module of the plurality of memory modules further comprises a memory element containing a parametric data set defining the first and second simulated waveforms and predetermined phase offset.

5. The apparatus as in claim 4 wherein each memory module of the plurality of memory modules further comprises a memory element containing a plurality of parametric data sets defining a plurality of first and second simulated waveforms and predetermined phase offsets.

6. The apparatus as in claim 5 wherein the portable apparatus further comprises a selector switch for selecting a parametric data set of the plurality of data of a memory module sets for generating the first and second simulated waveform with predetermined phase offset.

7. The apparatus as in claim 5 wherein each parametric data set of the plurality of parametric data sets further comprises a memory containing a look-up table of time versus voltage values for the first and second simulated waveforms and phase offsets of the first and second waveforms.

8. The apparatus as in claim 1 wherein the first simulated waveform further comprises a simulated waveform of a crankshaft position sensor of the reciprocating engine.

9. The apparatus as in claim 1 wherein the second simulated waveform further comprises a simulated waveform of a cam position sensor.

10. A portable apparatus for testing an electronic engine control system of a reciprocating engine comprising:

a first processor for generating a first simulated waveform of a rotational position of a first rotating engine element of the reciprocating engine;

a second processor for generating a second simulated waveform having a predetermined phase offset with respect to the first simulated waveform; and connector means for operably coupling the first and second waveforms to the engine control system.

11. The apparatus as in claim 10 further comprising a plurality of removable memory modules and a receptacle disposed on the portable apparatus for one-at-a-time coupling of a memory module of the plurality of memory modules to the first and second processors.

12. The apparatus as in claim 11 wherein each memory module of the plurality of memory modules further comprises a memory element containing a parametric data set defining the first and second simulated waveforms and predetermined phase offset.

13. The apparatus as in claim 11 wherein each memory module of the plurality of memory modules further comprises a plurality of parametric data sets defining a plurality of first and second simulated waveforms and predetermined phase offsets.

14. The apparatus as in claim 13 wherein the portable apparatus further comprises a selector switch for selecting a parametric data set of the plurality of data sets for generating the first and second simulated waveforms and predetermined phase offset.

15. The apparatus as in claim 13 wherein each parametric data set of the plurality of memory modules further comprises a memory containing a look-up table of time versus voltage values for the first and second simulated waveforms and predetermined phase offsets.

16. The apparatus as in claim 10 wherein the first simulated waveform further comprises a simulated waveform of a crankshaft position sensor of the reciprocating engine.

17. The apparatus as in claim 10 wherein the second simulated waveform further comprises a simulated waveform of a cam position sensor.

18. An apparatus for testing an engine control system of a reciprocating engine comprising:

a detachable memory module containing parametric data defining a plurality of sets of waveforms with each parametric set of the plurality of sets including a first and second waveform and predetermined phase offset;

a selector switch for selecting a set of waveforms of the plurality of sets of waveforms with predetermined phase offset;

a computer for generating the first and second waveform with the predetermined phase offset; and a connector for operably interconnecting the selected waveforms to the engine control system.

19. The apparatus as in claim 18 wherein a first simulated waveform of each set of waveforms further comprises a simulated waveform of a crankshaft position sensor of the reciprocating engine.

20. The apparatus as in claim 18 wherein a second simulated waveform of each set of waveforms further comprises a simulated waveform of a cam position sensor.

21. A detachable module for an apparatus for testing an engine control system comprising:

a memory element containing a set of parameters defining a first simulated waveform and a second simulated waveform offset with respect to the first simulated waveform by a predetermined phase offset; and a coupler for removably coupling the memory element to the apparatus for testing an engine control system.

22. A detachable memory module for an apparatus for testing an engine control system comprising:

a memory element containing a plurality of sets of parameters where each set of parameters defines a first simulated waveform and a second simulated waveform offset with respect to the first simulated waveform by a predetermined phase offset; and a coupler for removably coupling the memory element to the apparatus for testing an engine control system.

* * * * *